United States Patent [19]

Walker

[11] 4,304,640

[45] Dec. 8, 1981

[54] METHOD OF PLATING SOLDER ONTO PRINTED CIRCUIT BOARDS

[75] Inventor: John B. Walker, Basingstoke, England

[73] Assignee: Nevin Electric Limited, Colnbrook, England

[21] Appl. No.: 114,024

[22] Filed: Jan. 21, 1980

Related U.S. Application Data

[63] Continuation-in-part of Ser. No. 971,588, Dec. 20, 1978, abandoned.

[51] Int. Cl.$^3$ .................................................. C25D 5/02
[52] U.S. Cl. ...................................................... 204/15
[58] Field of Search ............................ 204/15, 30, 38 B

[56] References Cited

U.S. PATENT DOCUMENTS

| | | | |
|---|---|---|---|
| 2,872,391 | 2/1959 | Hauser | 204/15 |
| 2,897,409 | 7/1959 | Gitto | 204/15 |
| 3,208,921 | 9/1965 | Hill | 204/15 |
| 3,296,099 | 1/1967 | Dinella | 204/15 |
| 3,306,830 | 2/1967 | Bittrich | 204/15 |
| 3,702,284 | 11/1972 | Merkenschlager | 204/15 |
| 3,819,497 | 6/1974 | Grunwald | 204/15 |
| 3,873,429 | 3/1975 | Brown | 204/15 |

*Primary Examiner*—T. M. Tufariello
*Attorney, Agent, or Firm*—Blanchard, Flynn, Thiel, Boutell & Tanis

[57] ABSTRACT

In a method of electro-plating solder onto selected areas of the conductors of a printed circuit board, the following steps are followed: a continuous conductive surface is formed on a board carrying circuit conductors, a mask is formed on the surface to leave predetermined exposed areas, solder is electroplated on the said areas, and the mask and the remaining conductive surface are removed. The method is suitable for the plating of through holes in the board to connect conductors on the two sides of the board.

10 Claims, 1 Drawing Figure

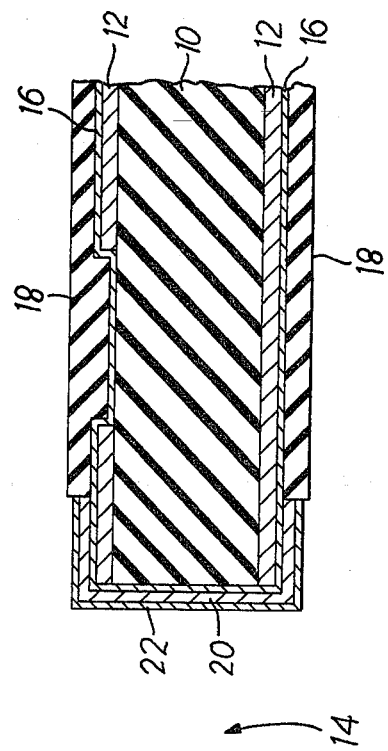
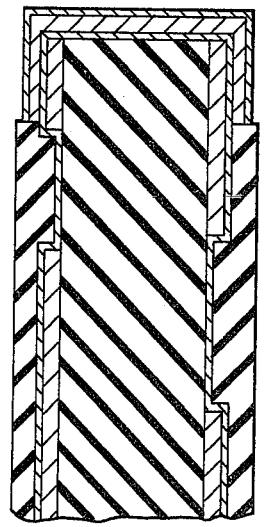

METHOD OF PLATING SOLDER ONTO PRINTED CIRCUIT BOARDS

CROSS-REFERENCE TO RELATED APPLICATION

This application is a continuation-in-part of my application Ser. No. 971,588 filed Dec. 10, 1978, now abandoned.

BACKGROUND OF THE INVENTION

The present invention relates to selectively solder-plated printed circuit boards, and to a method of making such boards by selectively printing solder on the printed circuit of a printed circuit board. The method can be used with single or double sided printed circuit boards, and enables a through connection to be made between the circuits on either face of a double sided printed circuit board.

Prior proposals in relation to printed circuit boards have included U.S. Pat. Nos. 3,819,497 (Grunwald et al), 2,897,409 (Gitto), 3,702,284 (Merkenschlager), and 2,872,391 (Hauser et al).

U.S. Pat. No. 3,819,497 proposes an improved plating process for plating copper particularly onto a copper foil laminate. A plain board of laminated construction having a copper outer laminate is punched to provide through holes, and after cleaning and catalyzation copper is electrolessly deposited over the entire exposed surface of the board including the holes. A circuit pattern is applied in subsequent steps. The board has to be baked at a temperature in excess of 150° F. from 10 mins to 2 hours to give adequate adhesion between the electrolessly plated copper coating and the initial copper-clad board surface. This patent is not concerned with solder-plating the circuit board.

U.S. Pat. No. 2,897,409 describes a process in which through holes are formed in a plain board having an outer copper laminate. The through holes are rendered conductive such as by spraying with colloidal size metal particles. Subsequently the circuit design is masked on the surface and the circuit conductors formed. Solder can be applied by dipping the board in molten solder.

In U.S. Pat. No. 3,702,284 a plain copper-clad board has a first resist material defining the desired conductor pattern printed thereon followed by a second resist material over the whole board surface. Through holes are then formed in the board and a metal layer applied by a metal reduction process on the hole walls, followed by electroplating on these surfaces. The second resist layer can then be removed and the desired circuit pattern subsequently formed. The first resist material may be solder resistant; with such an arrangement solder could be applied to the whole unprotected board areas, such as by dipping.

Finally, U.S. Pat. No. 2,872,391 discloses a similar process to U.S. Pat. No. 3,702,284 in using first and second resist layers, followed by the formation of through holes the surfaces of which are rendered conductive and plated. The second resist is removed and the conductor pattern formed. Solder is now plated over the whole conductor pattern and the holes.

It will be seen that none of the above patents is concerned with the selective electroplating of solder onto small portions of the conductor pattern on the circuit board. Furthermore, all the processes use plain laminated boards as the starting material; they are not applicable to the selective solder plating of circuit boards having the pattern already defined on them.

It is an object of the invention to provide for the electroplating of solder onto circuit boards having the circuit conductors already formed thereon.

It is another object of this invention to provide for the selective electroplating of solder onto desired regions of a circuit board.

It is a further object of the invention to provide such a method of solder deposition which gives a smooth, even finish, and in which the solder can reliably be localised to those areas where it is needed.

SUMMARY OF THE INVENTION

This invention provides a method of electroplating solder onto selected areas of the tracks or conductors of a printed circuit board. The method comprises first providing a board which has a printed circuit on a face thereof, plating the face with electrically conductive material to provide the face with a continuous conductive surface, forming an electrically insulating mask thereon to leave exposed the conductive surface in selected areas of the printed circuit, electroplating solder on the said selected areas using the said electrically conductive material as one electrode, removing the mask, and removing the electrically conductive material, whereby a selectively solder-plated prined circuit board is obtained.

By interconnecting the conductors and forming the mask, it is possible to deposit with good definition an even layer of solder on the selected areas of the printed circuit by electro-plating. The use of the mask enables the deposition of solder to be confined to the selected areas, the solder being built up to any desired thickness by the plating operation.

The method can also be used to plate solder on selected areas of printed circuits on both faces of a double-sided printed circuit board, and in a development described below can be used to make one or more through-connections between the circuits on the two faces. The basic printed circuit will usually be formed using conventional procedures, such as etching copper foil. The electrically conductive material used to interconnect the now established conductors of the printed circuit may be of the same material as the conductors and can be applied by electroless plating. The mask is then applied to localise the electro-plating to the selected areas e.g. where connections are to be made. A suitable plating mask can be made by marrying up a positive of the desired final solder pattern with a negative of the pattern of the conductors of the printed circuit. When so married, the two produce a negative of the desired plating mask. Once the selectively solder-plated printed circuit board has been produced, it is preferred to reflow the solder to give an improved finish and to apply a further selective mask of solder resist to the surface using the said appropriate final solder resist pattern. Such a selective mask can be applied using conventional procedures and may require stoving.

A requirement frequently arises for a double-sided printed circuit board having one or more connections through the insulating board which are coated with solder, preferably lead-tin solder. Hitherto this has been achieved, for example, by drilling apertures through an insulating board, forming a pattern of conductive material on both sides of the board and extending through the aperture or apertures, and electro-plating solder on the conductive material.

This method is not always feasible or appropriate, especially when the printed circuits are discontinuous. Like difficulties are encountered when printed circuit boards are manufactured by the etched foil technique, and there is a need for a simple and effective manner by which boards may be made with connections coated with solder between the printed circuits on double-sided boards.

This invention also provides a method of providing a through-connection between the two circuits on opposite faces of an already established double-sided printed circuit board. This improved method comprises the steps of providing a board which has printed circuits on the two faces thereof and an aperture extending between the faces and through conductors of the two circuits, interconnecting the conductors of the printed circuits by forming an interconnecting layer of electrically conductive material on the said faces and on the wall of the aperture, forming an electrically insulating mask thereon to leave exposed a conductive surface on the wall of the aperture and selected areas of the printed circuits, the said selected areas including a margin surrounding each mouth of the aperture, electro-plating solder on the wall of the aperture and the said selected areas using the interconnected conductors as one electrode, removing the mask, and removing the interconnecting electrically conductive material, whereby a double-sided printed-circuit board with a selectively solder-plated through-connection is obtained.

By using this method a through-connection plated with solder is provided in the form of a hollow eyelet with a flange of solder at each end. As before the solder can be built up to any desired thickness. More than one through-connection can readily be formed by providing more than one aperture and proceeding in a like manner. The aperture or apertures can be formed, e.g. by drilling, in a completed double sided circuit board, or at any convenient stage of the manufacture of the board. Before electro-plating of solder it is usually desirable to build up the thickness of the layer of electrically conductive material, especially on the wall or walls of the one or more apertures. This building up, say to 0.001", is carried out after the mask is applied and serves to ensure a good electrical through-connection.

BRIEF DESCRIPTION OF THE DRAWING

The invention will be described in more detail, by way of example, with reference to the drawing, which shows a crosssection through a portion of a printed circuit board being manufactured by the method.

DESCRIPTION OF THE PREFERRED EMBODIMENT

The method of the invention will be described with reference to the production of a double-sided printed circuit board having a through-connection between the two circuits on the opposite faces of the board.

A double-sided printed circuit board is first formed using the conventional etched foil technique. The resist pattern used during the etching operation is stripped off, leaving the board substrate 10 carrying conductors 12. An aperture 14 is drilled through the insulating support in register with two conductors to be connected to one another. Both faces of the board and the wall of the aperture are then rendered continuously conductive as at 16 by electroless plating using a copper system such as a Shipley sensitiser.

Once the conductive surface has been provided, a masking layer 18 of electrically-insulating material is formed on each face leaving clear a margin surrounding each end of the aperture 14.

The board is then immersed in a copper electro-plating bath (not shown) with the continuous conductive surface 16 as an electrode. The wall of the aperture and the said exposed margins are first electro-plated with copper 20 so as to build up the conductive surface on the walls and margins. Further to this, lead-tin solder 22 is plated on top of the copper. The plating operations provide a hollow eyelet of lead-tin solder on copper. In general, it is preferred to build up the conductive surface 20 on the walls and margins, e.g. by electro-plating, prior to plating on the solder. This building up serves to ensure a good electrical connection between the circuits on either face.

The various layers shown in the drawing are not to scale. The relative thicknesses will be as appropriate for any given application.

The masking pattern 18 is subsequently removed after the electro-plating operations, e.g. by soaking off. To facilitate this operation a resist as commonly used during etching may be employed as the electrically-insulating material. The conductive surface 16 in the areas between the conductors is subsequently removed with the aid of a suitable acid, the solder 22 reflowed and a solder mask applied to the conductors. The double-sided printed circuit board with the through connection is then ready for use.

In an alternative method this final solder mask can be applied to the conductors 12 before the application of the conductive surface 16. The masking layer 18 is applied as before and the exposed areas electro-plated with copper 20 which is in turn plated with solder 22. Removal of the masking layer 18 and conductive surface 16 leaves the conductors 12 covered with the mask.

The method provided by the invention is of wide applicability and is not limited to provision of through-connections between the two circuits on opposite faces of a double-sided printed circuit board. The illustrated procedure described above can readily be adapted to enable solder to be electro-plated on selected areas of the printed circuit of boards which do not have apertures. Deposition of solder can be confined to selected areas of the printed circuit where a connection is to be made.

I claim:

1. A method of providing a through-connection between the conductors of two circuits on opposite faces of a double-sided printed circuit board, which method comprises in sequence the steps of:
    providing a board which has printed circuit conductors preformed opposite each other on opposite faces of the board and an aperture preformed in the board and extending through said board and through the printed circuit conductors on said opposite faces of said board;
    plating an electrically conductive material simultaneously on the whole of said faces and on the wall of the aperture and thereby continuously plating from on one face of the board through the aperture onto the opposite face of the board, wherein said electrically conductive material is applied directly onto the conductors of the printed circuit and onto the surfaces of said board between said printed circuit conductors;

forming an electrically insulating mask on said faces while leaving exposed the conductive surface on the wall of the aperture and selected areas of the printed circuits, the said selected areas including a margin surrounding each mouth of the aperture, said mask-forming step including preparing a negative of the desired mask and thereby applying electrically insulating material over portions of said board including portions of said printed circuit conductors thereon except for selected areas including said margins immediately surrounding each end of said aperture;

electro-plating solder on the wall of the aperture and the said selected areas using said electrically conductive material as one electrode, said step of electro-plating solder including applying of a solder layer over the initial electrically conductive material plated on said aperture wall and faces of said board in said initial plating step preceding said masking step;

removing the mask; and removing the electrically conductive material, whereby a double-sided, printed-circuit board with a selectively solderplated through-connection is obtained.

2. A method according to claim 1, when used to form a plurality of through-connections.

3. A method according to claim 1, wherein the electrically conductive material is the same as the material of the printed circuit.

4. A method according to claim 1, wherein the electrically conductive material is applied by electroless plating.

5. A method according to claim 4, wherein the electrically conductive material is built up on the wall of the aperture by electroplating before electroplating of solder.

6. A method according to claim 1, wherein the electrically insulating mask is made by marrying up a positive of the desired final solder pattern with a negative of the pattern of the conductors of the printed circuit.

7. A method according to claim 1, wherein the electro-plated solder is reflowed and a further selective mask of solder resist applied.

8. A method according to claim 1, wherein said electrically conductive material interconnects the conductors of the printed circuit.

9. A method according to claim 1, wherein a further mask is applied on said face prior to said step of plating said electrically conductive material.

10. A printed circuit board when produced by the method of claim 1.

* * * * *